June 18, 1957 J. J. DYMON 2,796,564

ELECTRIC CIRCUIT ELEMENT

Filed Dec. 21, 1953

INVENTOR
JOSEPH J. DYMON
BY
F. Kumpl
ATTORNEY

United States Patent Office 2,796,564

Patented June 18, 1957

2,796,564

ELECTRIC CIRCUIT ELEMENT

Joseph J. Dymon, Flushing, N. Y., assignor to Sylvania Electric Products Inc., a corporation of Massachusetts Application December 21, 1953, Serial No. 399,456

25 Claims. (Cl. 317—237)

This invention deals with electric circuit elements of the semi-conductor type. More particularly, it is a description of a group of novel compositions consisting primarily of alkaline earth titanates or mixtures thereof in a reduced state which are effective as crystal rectifiers.

A crystal rectifier is a non-linear device which has the property of transforming alternating current into direct current and is capable of handling fairly broad frequencies of alternation of the source current. Such crystal rectifiers depend for their action for the most part on the presence of regional areas generally at the surface to which current is conducted more readily in one direction than in the other direction. Such regions or areas have been designated as barrier layers. These barrier layers are extremely thin and their effectiveness may be designated by the fact that normally the resistances in non-conducting direction may be several thousand times higher than the resistance in the conducting direction.

Two fairly standard means have been developed for using such rectifiers. The first involves application of an extremely fine point. A major function of the use of such point contact is miniaturization and reduction of electrostatic capacity. Under these conditions the crystal rectifier is suitable for high frequency purposes and is used as a detector in the micro-wave region as a substitute for a vacuum tube. As a matter of fact point contact crystal rectifiers were very common devices in the early history of radio communication and detectors. They fell into obscurity with the development of the vacuum tube and again became quite important in later years with the expansion of communications and high frequency in micro-wave regions. The area type rectifier is most useful for power conversion purposes in which the transfer of massive amounts of A. C. power into comparable D. C. power is desired. When made in large banks such fixed rectifiers are sufficient substitutes for motor generator sets.

In the early days the most common crystal rectifier was galena and as indicated an important component in such early radio receivers was a piece of galena and its attendant cat whisker. More recently, germanium and silicon have emerged as important crystal rectifier materials for the point contact construction. Materials most useful for power conversion purposes are selenium, copper oxide and magnesium sulfide.

Germanium and silicon point contact rectifiers suffer from several disadvantages. Germanium is an expensive material and must be very carefully processed in order to obtain the best results. While the resistance ratios are high and the voltage of operation are correspondingly high the carrying capacity is relatively low. In view of the method of preparation of both silicon and germanium the materials are inherently expensive. In the case of both selenium and copper oxide the most common type of plate or area type rectifying materials the voltage carrying capacity is relatively low or in terms of the electrical engineer the back voltage does not exceed 50 to 60 volts.

More recently a group of electric circuit elements have been developed whose base material consists primarily of an alkaline earth titanate in a reduced state. Such circuit elements have been described in my copending applications as follows: Serial No. 341,726, filed March 11, 1953; Serial No. 365,987, filed July 3, 1953; Serial No. 366,038, filed July 3, 1953.

Although the circuit elements produced in accordance with the disclosures made in the above-noted patent applications have exhibited certain good properties from a rectifier viewpoint they were found to have one major fault in that their efficiency decreased fairly rapidly upon life.

It is an object of this invention to develop a group of crystal rectifier materials which are useful both as point contact and area type rectifiers.

It is another object of this invention to develop materials which are relatively inexpensive and which may be processed by simple means to make them useful both as point contact and area type rectifiers.

It is a still further object of this invention to develop crystal rectifiers which under proper operating conditions will stand exceptionally high operating voltages and high operating currents so that when properly used they exhibit advantages over existing fixed rectifying devices.

It is another object of this invention to develop titanate rectifiers which will maintain their efficiency over relatively long life.

In accordance with our invention these and other advantages which are incidental to their application can be obtained with reduced titanates of the alkaline earth metals particularly those titanates of barium, strontium, calcium or mixtures of barium, strontium and calcium when these titanates are made effective for rectifying purposes by ceramic procedures, pretreated to remove the surface skin, conditioned and coated with a layer of lead dioxide or manganese dioxide.

In the accompanying drawings which illustrate preferred forms of devices embodying features of this invention, Figure 1 is a perspective view partly in section showing the disc of a reduced titanate of an alkaline earth metal oxidized on one surface and having an applied lead dioxide film thereon. The other side has an applied metal conducting electrode.

When fired in an oxidizing atmosphere through vitrification the titanates are first class insulators having resistivities of the order of thousands of megohm centimeters. It has been found that when these titanates are fired in a strongly reducing atmosphere through vitrification the resistivities are of the order of a few ohm centimeters and the fully reduced material exhibits non-linear characteristics. If a barrier layer is then formed on the surface the system functions as an efficient rectifier.

Figure 1:
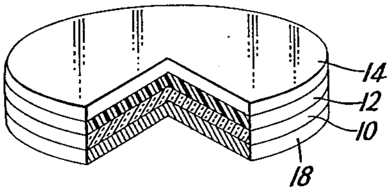

In Figure 1 of the drawings 10 represents a reduced titanate of an alkaline earth metal, 12 represents lead dioxide coating on the top surface of the reduced titanate and 14 represents an electrical conducting coating. Additional layer 16 shown in Figure 2 as superimposed on layer 12 represents a counter-electrode material which may preferably be made of a soft metal such as lead or cadmium.

The general method of preparation involves formation of a part or sheet by compression of powder. The formed pellet is then fired in a dry reducing atmosphere at temperatures on the order of 2000 to 2600° F. and then permitted to cool in such atmosphere. The surface of the pellet is then given a lead dioxide or manganese dioxide coating. This may be accomplished by electrodeposition.

Figure 2:
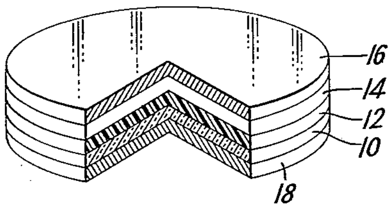
Figure 2 is a perspective view partly in section of an area type rectifier of this invention.
Figure 3:
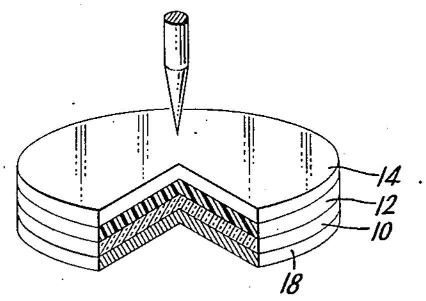
Figure 3 is a perspective view partly in section of a point type rectifier of this invention.

A variety of counter-electrodes are suitable for developing the most useful properties but of these it has been found that relatively soft blunt points are most effective and such points are made of lead or combinations of tin, lead or cadmium. These metals may be in the form of points 18 as shown in Figure 3 in which a considerable pressure is developed at point of contact or as an area covering the entire effective surface of the reduced and lead dioxide coated titanate pellet as shown in Figure 2. Such contact electrodes become effective under the application of pressure.

Specifically the method of preparation of these various rectifying materials is subject to a number of preferred variations which will be described in detail. Titanates of calcium, strontium and barium individually or in admixture with one another are available commercially in the form of fully reactive ceramic powders having a particle size in the range of 3 to 10 microns. These in accordance with one preferred method are formed into shape from a mixture consisting of 100 parts of any of the powder titanates, ten parts of a 15% solution of polyvinyl alcohol. Other tempering agents such as ethyl cellulose in the form of a 2% solution may conveniently be used; in cases where the organic material creates a problem with respect to maintaining reasonably clean furnace atmosphere, water alone is suitable. The advantages of such agents as polyvinyl alcohol and methyl cellulose is to provide sufficient strength so that the clean pieces may be handled without fear of breaking prior to their insertion into the furnace. The pellets are then pressed with pressures of the order of 4000 to 8000 lbs. per square inch. After being dried at room temperature for a period of 24 hours they are placed inside saggers whose interior is lined with a smooth surface of a non-reacting material such as powdered barium zirconate. The function of the barium zirconate is to prevent reaction between the titanate material and the sagger material at the elevated temperatures to which the devices are fired. The pieces are then fired in a hydrogen furnace at temperatures at the order of 2000 to 2600° F. and are maintained at this top temperature for a period of three hours. Clean pure hydrogen is used.

The titanate rectifying materials may also be prepared with the use of a trivalent rare earth doping agent such as lanthanum. Amounts of lanthanum up to 5% have been used successfully for this purpose. It has been found that when the lanthanum doping agent is used it is possible to replace part of the hydrogen in the furnace with helium. This is of some importance in the processing steps since the addition of helium helps to cut down the amount of water vapor which would normally be formed and also helps to reduce the normal hazards of working with a hydrogen furnace. In those cases in which amounts of 3% of lanthanum are used in the doping of the titanate the ratio of helium to hydrogen can be as much as eight to one.

In contact with the reduced titanate body is an electrode which has been found to be most effective and which consists of a relatively thin coating of lead dioxide or maganese dioxide. This oxide coating on the titanate body can naturally be applied in several ways. The one which has been found to be most easily applicable is one in which the oxide coating is applied electrolytically. This coating is applied from an electrolytic solution which can be made, for example, by mixing together lead nitrate or maganous sulfate and water, with or without nitric acid. An example of such solution would contain 50–250 gms. lead nitrate or 20–250 gms. manganous sulfate, 0–50 cc. concentrated nitric acid and sufficient water to make one liter of solution.

In order to improve the quality of the base material and thereby make it most suitable for the application of a barrier layer the ceramic pellet formed in accordance with the above procedure should be pretreated to remove the entire surface skin. This may be accomplished in many ways. It is preferably done mechanically so as to avoid any possible chemical contamination. Basically, this step is preferably accomplished by sand blasting the surface which is subsequently to be used as the barrier layer surface. The sand blasting operation is carried out until the actual bulk material of the pellet is exposed and the entire surface skin has been removed. This may be accomplished in most instances by using 20 mesh sand, for example, which is carried by air under a pressure of 50 p. s. i., the blasting time being something under one minute. This step removes any possible foreign chemicals which may be present on the surface so that subsequent treatment can be carried out on surfaces which are more truly representative of the bulk material of the pellet. It furthermore produces a larger surface area for a unit of given dimensions and therefore tends to reduce the forward resistance of the material when it is used as a rectifier. The treatment also results in producing a pellet which has a larger and rougher surface which promotes better adherence of the cement counter electrode which is subsequently applied. After the ceramic unit has been sand blasted it is thoroughly washed to remove any dust accumulations.

The material in this state is then ready for the next operation which is preferably thermal oxidation or conditioning of the ceramic unit. To accomplish this the dry sand blasted units are thermally fired in an atmosphere furnace. Since only one surface of the ceramic unit is to be coated with the barrier layer it is preferable to place the ceramic units in the furnace in such manner as to expose only that surface to the atmosphere. For best results the other side of the unit may be protected during the thermal firing by suitable protective coatings so that the base electrode surface exposure to the oxidizing atmosphere is minimized. Of the many oxidizing atmospheres that can be used dry air or dried oxygen gas is preferred. In operation the furnace is thoroughly flushed with the oxidizing gas after the pellets are placed into it at room temperature. The temperature of the furnace is raised to operating level at a rate of about 300° C. per hour to minimize thermal shock to the ceramic units. The final operating temperature as well as the length of time required for the oxidation of the ceramic units is somewhat dependent upon the exact nature of the ceramic unit involved. Single crystal units in general require short firing cycles, for example, 10–20 minutes at temperatures in the range of 500–700° C., whereas lanthanum containing ceramic units require much longer firing times ranging from ½ to 2 hours at temperatures in the range of 800–1000° C. Ceramic units containing no lanthanum require firing schedules of approximately the same time and temperature relationship as the single crystal units described above.

These sand blasted and thermally oxidized ceramic units seem to offer the following advantages over the ceramic units which have been only conditioned electrolytically. They apparently give an oxidized layer which is more adaptable for the formation of a uniform barrier layer. They furthermore help to produce a material which has a better controlled $I_p$ value during the electrolytic conditioning step which later follows and it furthermore helps to increase the life of the ceramic unit when it is used as a rectifier.

Although the base electrodes are usually applied at this step of the process their application may be delayed to advantage. If the base electrode surface of the ceramic unit was protected during the thermal oxidation step a metallic base electrode may be applied directly to the ceramic body. However, to insure an electrode having the lowest possible electrical resistance it is sometimes preferable to carry out a second sand blasting operation in order to remove any oxidized material from the base electrode surface. The same techniques described above may be used for this purpose. Naturally, care has to be exercised during this step in the handling of the thermally oxidized surface. After sand blasting the pellet can be washed with distilled water and dried, after which any one of a number of metallic electrodes may be applied to the sand blasted base as, for example, sprayed powder, sprayed alloys, fired alloys, silver conducting paint, or electrodeposited metal electrodes. As has been indicated above in using any of these techniques for applying the base electrode care must be taken to protect the oxidized barrier layer surface from chemical and physical contamination or destruction. The choice of a method for applying the base electrode is dictated solely by the resistance which it may have.

The electrolytic conditioning step and the plating step for applying the lead dioxide or manganese dioxide layer may, as described, be carried out in the same electrolytic bath.

Figure 4:
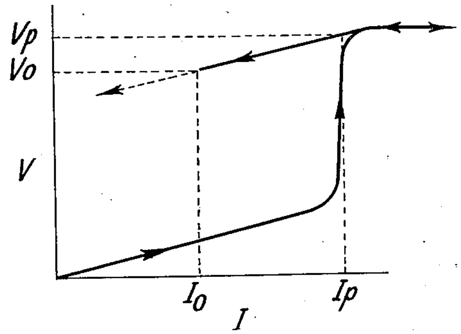
Figure 4 is a curve illustrating current voltage relationship during the formation of a barrier layer.

Sometimes a current voltage relationship is obtained when a ceramic titanate pellet is introduced as the anode in an electrolytic cell as illustrated in Figure 4 of the drawings. As the current is slowly increased a point is reached at which the voltages rises rather suddenly. At this point the pellet is polarized, that is to say, anodically oxidized. It is not necessary that any metallic salts be present in the cell for this to occur. It has, however, been found that after the surface has been polarized it has been properly "conditioned" to accept a further layer of lead dioxide which will rectify.

The second step is plating. It is important, however, that the surface be polarized in addition to being merely plated. A plate which is laid down over an unpolarized surface even when subsequently formed electrolytically results in a pellet with a very low breakdown voltage. The main purpose of plating is to permit the formation of a better barrier layer than can be achieved with oxidation alone. Although there are several different plating baths which can be used advantageously a lead nitrate bath or a manganese sulfate bath has been found to give excellent results.

Although the polarization of the surface can be carried out in a nitric acid solution followed by plating in a lead nitrate solution the latter may be used to accomplish both steps in one operation. It has been found that the pellets may vary widely in the value of $I_p$ (Figure 4) but that maximum practicable polarizing voltage generally lies in the range of 35–40 volts. Therefore, the coating technique emphasizes the voltage, rather than current. After polarization has taken place the voltage is cut back by 3 to 6 volts to the operating value, $V_o$ used for the plating step. The plating is then allowed to continue for zero to ten minutes and takes place at a fixed voltage $V_o$ and at an operating current $I_o$ the value of which falls with time. A lead dioxide layer of a mere few molecular layers is sufficient. If the operating voltage is too close to $V_p$ sparking occurs on the pellet surface and the resulting plate is unsatisfactory. If $V_o$ is greater than $V_p$ the principal reaction at the anode consists of attack on the pellet turning it white and rendering it almost useless as a rectifier. After plating the pellet it is preferably rinsed and dried in hot air.

When this material is used as a rectifier the contact can be made through the barrier layer by means of a dull point of soft material such as lead or tin when the rectifier is to be used as a point contact rectifier or the counter electrode may be formed on top of the barrier surface through a plate of solder, cadmium or similar metal.

Under proper conditions breakdown voltages as high as 65–110 volts D. C. can be obtained before breakdown while forward currents of the order of 300–400 ma. can be obtained at 2–6 volts. At resistances of about 2 ohms the efficiency of this rectifier has been found to be 75–85%.

It has been further found that the rectification properties can be further improved by applying a second layer to the metallic oxide coating. This layer is preferably applied in the form of a paste which has been formed by intimately mixing the metal oxide powder, for example, lead dioxide or manganese dioxide in a binder such as silicone cement. This feature is more specifically described in the application entitled "Alkaline Earth Titanate Rectifiers," Serial No. 365,987 in which Joseph J. Dymon is given as the inventor.

While the above description and drawings submitted herewith disclose a preferred and practical embodiment of the electric circuit element of this invention it will be understood that the specific details of construction and arrangement of parts as shown and described are by way of illustration and are not to be construed as limiting the scope of the invention.

What is claimed is:

1. An electric circuit element of the semi-conductor type comprising a reduced titanate of an alkaline earth metal having a double layer on a freshly skinned and subsequently oxidized surface thereof consisting of an electrolytically deposited metal oxide coated with a paste consisting of a mixture of metal oxide powder and a binder.

2. An electric circuit element of the semi-conductor type comprising a reduced titanate of an alkaline earth metal having a double layer on a freshly skinned and subsequently oxidized surface thereof consisting of an electrolytically deposited lead dioxide layer coated with a paste consisting of a mixture of a metal oxide powder and a binder.

3. An electric circuit element of the semi-conductor type comprising a reduced titanate of an alkaline earth metal having a double layer on a freshly skinned and subsequently oxidized surface thereof consisting of an electrolytically deposited lead dioxide layer coated with a paste consisting of a mixture of lead dioxide powder and a binder.

4. An electric circuit element of the semi-conductor type comprising a reduced titanate of an alkaline earth metal having a double layer on a freshly skinned and subsequently oxidized surface thereof consisting of an electrolytically deposited lead dioxide coated with a paste consisting of a mixture of metal oxide powder and a silicone binder.

5. An electric circuit element of the semi-conductor type comprising a reduced titanate of an alkaline earth metal having a double layer on a freshly skinned and subsequently oxidized surface thereof consisting of an electrolytically deposited lead dioxide coated with a paste consisting of a mixture of lead dioxide powder and a silicone binder.

6. An electric circuit element of the semi-conductor type comprising a reduced titanate of an alkaline earth metal having a double layer on a freshly skinned and subsequently oxidized surface thereof consisting of an electrolytically deposited lead dioxide coated with a paste consisting of a mixture of lead dioxide powder and a silicate binder.

7. An electric circuit element of the semi-conductor type comprising a reduced titanate of an alkaline earth metal having a double layer on a freshly skinned and subsequently oxidized surface thereof consisting of an electrolytically deposited metal oxide coated with a paste consisting of a mixture of metal oxide powder and a silicone binder.

8. An electric circuit element of the semi-conductor type comprising a reduced titanate of an alkaline earth metal having a double layer on a freshly skinned and subsequently oxidized surface thereof consisting of an electrolytically deposited metal oxide coated with a paste consisting of a mixture of metal oxide powder and a silicate binder.

9. In a rectifier an electrode in contact with one surface of a reduced titanate of an alkaline earth metal, a metal oxide layer in contact with an oppositely disposed surface of said titanate, said surface having been previously freshly skinned and oxidized, a coating on said metal oxide consisting of a mixture of metal oxide powder and a binder and a counter electrode in contact with said coating.

10. In a rectifier an electrode in contact with one surface of a reduced titanate of an alkaline earth metal, a lead dioxide layer in contact with an oppositely disposed surface of said titanate, said surface having been previously freshly skinned and oxidized, a coating on said lead dioxide consisting of a mixture of metal oxide powder and a binder and a counter electrode in contact with said coating.

11. In a rectifier an electrode in contact with one surface of a reduced titanate of an alkaline earth metal, a lead dioxide layer in contact with an oppositely disposed surface of said titanate, said surface having been previously freshly skinned and oxidized, a coating on said lead dioxide consisting of a mixture of lead dioxide powder and a binder and a counter electrode in contact with said coating.

12. In a rectifier an electrode in contact with one surface of a reduced titanate of an alkaline earth metal, a metal oxide layer in contact with an oppositely disposed surface of said titanate, said surface having been previously freshly skinned and oxidized, a coating on said metal oxide consisting of a mixture of metal oxide powder and a silicone binder and a counter electrode in contact with said coating.

13. In a rectifier an electrode in contact with one surface of a reduced titanate of an alkaline earth metal, a manganese oxide layer in contact with an oppositely disposed surface of said titanate, said surface having been previously freshly skinned and oxidized, a coating on said manganese oxide consisting of a mixture of metal oxide powder and a binder and a counter electrode in contact with said coating.

14. In a rectifier an electrode in contact with one surface of a reduced titanate of an alkaline earth metal, a manganese oxide layer in contact with an oppositely disposed surface of said titanate, said surface having been previously freshly skinned and oxidized, a coating on said manganese oxide consisting of a mixture of manganese oxide powder and a binder and a counter electrode in contact with said coating.

15. In a rectifier an electrode in contact with one surface of a reduced titanate of an alkaline earth metal, a lead dioxide layer in contact with an oppositely disposed surface of said titanate, said surface having been previously freshly skinned and oxidized, a coating on said lead dioxide consisting of a mixture of lead dioxide powder and a silicate binder and a counter electrode in contact with said coating.

16. In a rectifier an electrode in contact with one surface of a reduced titanate of an alkaline earth metal, a lead dioxide layer in contact with an oppositely disposed surface of said titanate, said surface having been previously freshly skinned and oxidized, a coating on said lead dioxide consisting of a mixture of lead dioxide powder and a silicone binder and a counter electrode in contact with said coating.

17. In the method of making an electric circuit element of the semi-conductor type the steps comprising reducing a titanate of an alkaline earth metal, freshly skinning a surface thereof, oxidizing said surface, coating said oxidized surface with a metal oxide and coating said metal oxide with a mixture of metal oxide powder and a binder.

18. In the method of making an electric circuit element of the semi-conductor type the steps comprising reducing a titanate of an alkaline earth metal freshly skinning a surface thereof, oxidizing said surface, coating said oxidized surface with a lead dioxide and coating said lead dioxide with a mixture of metal oxide powder and a binder.

19. In the method of making an electric circuit element of the semi-conductor type the steps comprising reducing a titanate of an alkaline earth metal, freshly skinning a surface thereof, oxidizing said surface, coating said oxidized surface with a metal oxide and coating said metal oxide with a mixture of metal oxide powder and a silicone binder.

20. A rectifier comprising a body of a reduced alkaline earth metal titanate having a mechanically roughened, thermally oxidized and anodically conditioned surface, and a metallic dioxide layer formed on said surface.

21. A rectifier comprising a body of a reduced alkaline earth metal titanate having a mechanically roughened, thermally oxidized and anodically conditioned surface, and a metallic dioxide layer formed on said surface, said layer being of a material selected from the group consisting of lead dioxide and manganese dioxide.

22. In the manufacture of a rectifier, the steps including forming a body of a reduced alkaline earth metal titanate, mechanically roughening a surface of said body, thermally oxidizing said surface of said body, and forming a metallic dioxide layer on said surface of said body.

23. In the manufacture of a rectifier, the steps including forming a body of a reduced alkaline earth metal titanate, mechanically roughening a surface of said body, thermally oxidizing said surface of said body, anodically oxidizing said surface of said body, and forming a metallic dioxide layer on said surface of said body.

24. In the manufacture of a titanate rectifier, the steps including preparing a body of reduced alkaline earth metal, mechanically roughening and thermally oxidizing a surface of said body, introducing said surface as anode into a plating bath, and operating said bath at a current density sufficient to anodically oxidize said surface.

25. In the manufacture of a titanate rectifier, the steps including preparing a body of reduced alkaline earth metal, sand blasting a surface of said body, thermally oxidizing said surface of said body, introducing said surface as anode into a plating bath, and operating said bath at a current density sufficient to anodically oxidize said surface of said body.

References Cited in the file of this patent

UNITED STATES PATENTS

| | | |
|---|---|---|
| 1,924,300 | Atherton | Aug. 29, 1933 |
| 1,932,067 | Duhme | Oct. 24, 1933 |
| 2,633,543 | Howatt | Mar. 31, 1953 |

FOREIGN PATENTS

| | | |
|---|---|---|
| 672,732 | Great Britain | May 28, 1952 |

OTHER REFERENCES

Henisch: Metal Rectifiers, Oxford, at the Clarenden Press, pp. 127–130.